(12) United States Patent
Kim

(10) Patent No.: US 8,368,456 B2
(45) Date of Patent: Feb. 5, 2013

(54) FUSE CIRCUIT WITH ENSURED FUSE CUT STATUS

(75) Inventor: Keun Kook Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 93 days.

(21) Appl. No.: 12/975,043

(22) Filed: Dec. 21, 2010

(65) Prior Publication Data

US 2011/0241761 A1   Oct. 6, 2011

(30) Foreign Application Priority Data

Mar. 31, 2010   (KR) .................. 10-2010-0029515

(51) Int. Cl.
*H01H 37/76* (2006.01)
(52) U.S. Cl. ................... 327/525; 365/225.7
(58) Field of Classification Search ............... 327/525, 327/526; 365/225.7
See application file for complete search history.

(56) References Cited

U.S. PATENT DOCUMENTS

| | | | | |
|---|---|---|---|---|
| 5,548,555 A * | 8/1996 | Lee et al. | | 365/200 |
| 5,862,087 A * | 1/1999 | Lee | | 365/200 |
| 5,901,094 A * | 5/1999 | Chin et al. | | 365/200 |
| 6,021,078 A | 2/2000 | Le | | |
| 6,147,546 A * | 11/2000 | Verwegen | | 327/525 |
| 6,320,802 B1 * | 11/2001 | Ohbayashi | | 365/200 |
| 6,333,666 B2 * | 12/2001 | Kim et al. | | 327/525 |
| 6,566,937 B1 * | 5/2003 | Mori et al. | | 327/525 |
| 7,411,851 B2 * | 8/2008 | Ueda | | 365/225.7 |
| 7,688,664 B2 * | 3/2010 | Yamaguchi | | 365/225.7 |
| 7,902,903 B2 * | 3/2011 | Rosik et al. | | 327/525 |
| 7,907,465 B2 * | 3/2011 | Peng et al. | | 365/225.7 |
| 8,026,737 B2 * | 9/2011 | Moon et al. | | 326/16 |
| 2004/0046601 A1 * | 3/2004 | Jung et al. | | 327/525 |

FOREIGN PATENT DOCUMENTS

| KR | 1020020077035 A | 10/2002 |
|---|---|---|
| KR | 1020080099976 A | 11/2008 |

\* cited by examiner

*Primary Examiner* — Thomas J Hiltunen
(74) *Attorney, Agent, or Firm* — William Park & Associates Ltd.

(57) ABSTRACT

A fuse circuit includes a fuse information signal generation unit and an output driving unit. The fuse information signal generation unit is configured to precharge a fuse information signal in response to a precharge signal and drive the fuse information signal in response to a selection signal capable of cutting a fuse. The output driving unit configured to equally maintain potentials at both terminals of the fuse in response to a control signal.

12 Claims, 2 Drawing Sheets

FUSE CIRCUIT WITH ENSURED FUSE CUT STATUS

CROSS-REFERENCES TO RELATED APPLICATIONS

The present application claims priority under 35 U.S.C 119(a) to Korean Application No. 10-2010-0029515, filed on Mar. 31, 2010, in the Korean intellectual property Office, which is incorporated herein by reference in its entirety.

BACKGROUND

The present invention relates generally to a semiconductor device, and more particularly to a fuse circuit in a semiconductor device with features to ensure the cut status when a fuse is cut.

Semiconductor integrated circuits utilize option processing such as a bonding option, a metal option, and a fuse option for mode switching.

In particular, the fuse option is widely used to replace faulty semiconductor memory cells caused during a fabrication process with normal memory cells and to accommodate to a design change for a semiconductor memory chip modification. In a fuse option, a fuse is cut by irradiating laser beams or flowing an excessive current. A circuit including at least one fuse for the fuse option is referred to as a fuse circuit.

FIG. 1 shows a conventional fuse circuit.

In FIG. 1, the node nd10 of the conventional fuse circuit is precharged to a logic high level in response to a precharge signal FPCG enabled to a logic low level. Then, when the precharge signal FPCG is disabled to a logic high level, first to eighth selection signals SEL<1:8> are inputted, and a level of a latch output signal OUT is determined.

The level of the latch output signal OUT may vary according to the cutting of first to eighth fuses F11-F18. For example, when only the second selection signal SEL<2> among the selection signals SEL<1:8> is inputted at a logic high level, the level of the latch output signal OUT is determined according to the cutting of the second fuse F12. That is, when the second fuse F12 is not cut, the latch output signal OUT is outputted at a logic low level. When the second fuse F12 is cut, the latch output signal OUT is outputted at a logic high level.

In a case where the first to eighth fuses F11-F18 are formed of a material such as copper (Cu), the second fuse F12 cut in the above example is again coupled, causing an error that the latch output signal OUT is outputted at a logic low level. This is because copper ions are moved to fill the cut portion when there is a potential difference between both ends of the first to eighth fuses F11-F18.

SUMMARY

An embodiment of the present invention provides a fuse circuit in which a potential difference does not occur between both ends of a cut fuse, thereby substantially preventing an occurrence of error.

In one embodiment, a fuse circuit includes: a fuse information signal generation unit configured to precharge a fuse information signal in response to a precharge signal, and drive the fuse information signal in response to a selection signal and a cutting of a fuse; and an output driving unit configured to equally maintain potentials at both terminals of the fuse drive the fuse information signal in response to a control signal.

In another embodiment, a fuse circuit includes: a precharge unit configured to precharge a fuse information signal in response to a precharge signal; a fuse coupled between a first node, through which the fuse information signal is outputted, and a second node; a switch element configured to be turned on in response to a selection signal and pull-down drive the second node; and an output driving unit configured to pull-down drive the first node in response to a control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
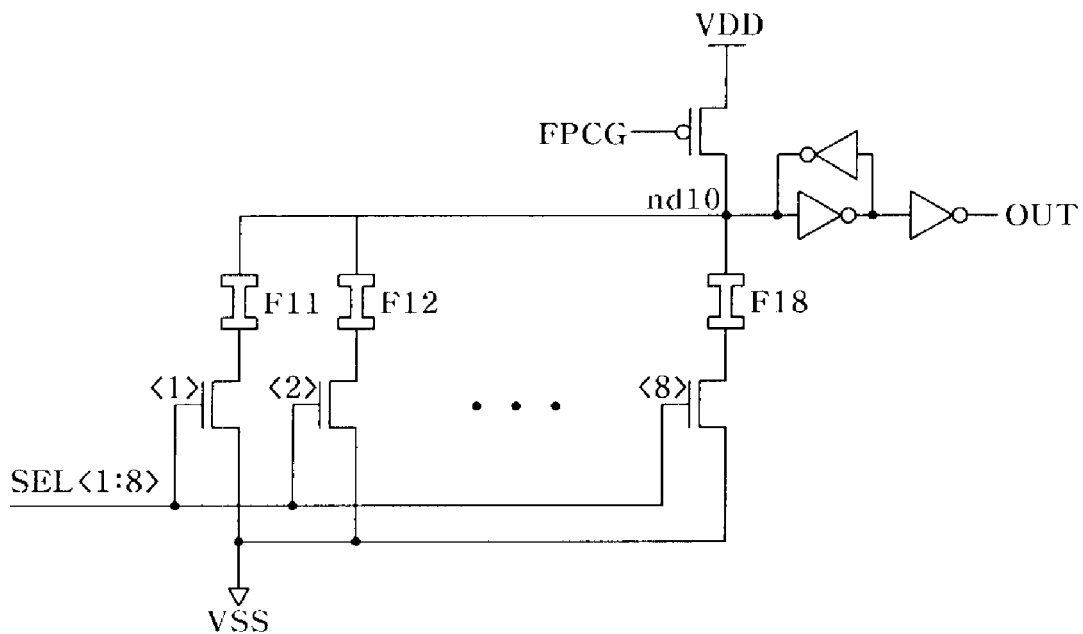
FIG. 1 is a circuit diagram illustrating a configuration of a conventional fuse circuit.
Figure 2:
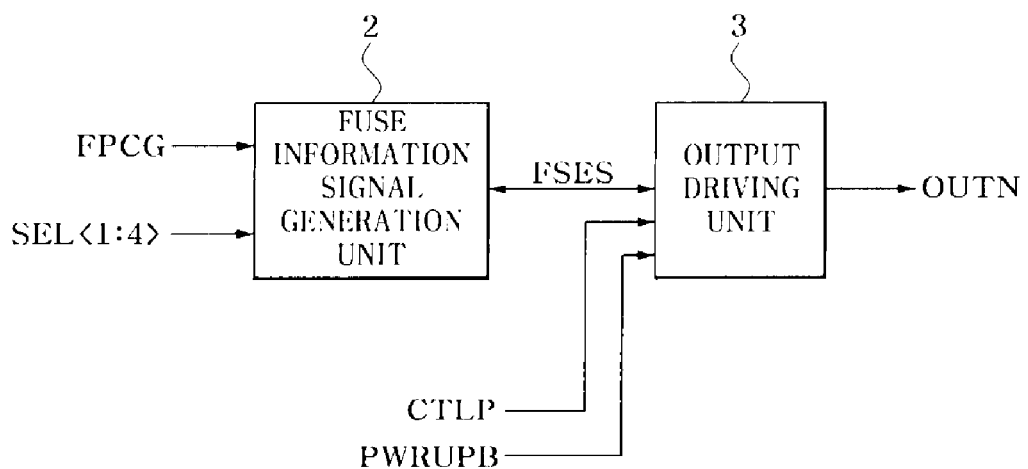
FIG. 2 is a block diagram illustrating a configuration of a fuse circuit according to an embodiment of the present invention.

FIG. 2 is a block diagram illustrating a configuration of a fuse circuit according to an embodiment of the present invention.

As illustrated in FIG. 2, the fuse circuit according to an embodiment of the present invention includes a fuse information signal generation unit 2 and an output driving unit 3. The fuse information signal generation unit 2 is configured to precharge a fuse information signal FSES in response to a precharge signal FPCG, and to drive the fuse information signal FSES in response to first to fourth selection signals SEL<1:4>, and to attend to the cutting of first to fourth fuses F21, F22, F23, F24. The output driving unit 3 is configured to equally maintain potentials at both terminals of the first to fourth fuses F21, F22, F23, F24 by driving the fuse information signal FSES in response to a control signal CTLP.

Figure 3:
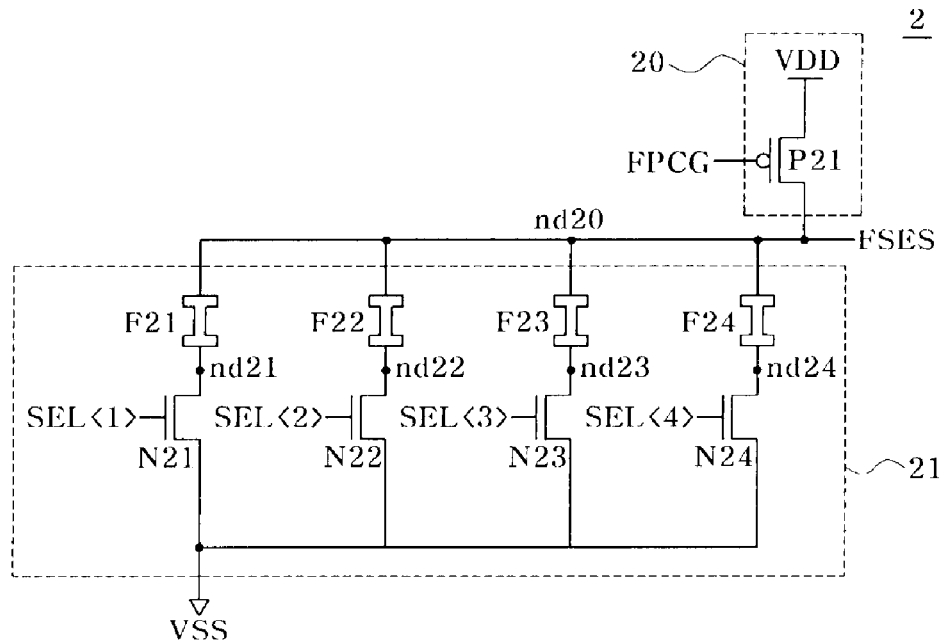
FIG. 3 is a circuit diagram of a fuse information signal generation unit included in the fuse circuit of FIG. 2.

More specifically, referring to FIG. 3, the fuse information signal generation unit 2 includes a precharge element 20 and a pull-down section 21. The precharge element 20 is configured to pull-up drive the fuse information signal FSES in response to the precharge signal FPCG. The pull-down section 21 is configured to pull-down drive the fuse information signal FSES in response to the first to fourth selection signals SEL<1:4> and the cutting of the first to fourth fuses F21, F22, F23, F24.

The precharge element 20 includes a PMOS transistor P21 coupled between a power supply voltage terminal VDD and a node nd20. The precharge signal FPCG applied to the gate of the PMOS transistor P21 is a signal which is applied at a logic low level in order for a precharge operation and then changes to a logic high level.

The pull-down section 21 includes first to fourth fuses F21, F22, F23, F24 and NMOS transistors N21, N22, N23, N24. The first fuse F21 is coupled between the node nd20 and a node nd21, and the NMOS transistor N21 operates as a switch which is coupled between the node nd21 and the ground voltage terminal VSS and turned on in response to the first selection signal SEL<1>. The second fuse F22 is coupled between the node n20 and a node nd22, and the NMOS transistor N22 operates as a switch which is coupled between the node nd22 and the ground voltage terminal VSS and turned on in response to the second selection signal SEL<2>. The third fuse F23 is coupled between the node n20 and a node nd23, and the NMOS transistor N23 operates as a switch which is coupled between the node nd23 and the ground voltage terminal VSS and turned on in response to the third selection signal SEL<3>. The fourth fuse F24 is coupled between the node nd20 and a node nd24, and the NMOS transistor N24 operates as a switch which is coupled between the node nd24 and the ground voltage terminal VSS and turned on in response to the fourth selection signal SEL<4>. The first to fourth selection signals SEL<1:4> are signals which are selectively enabled to a logic high level at preset timings after the precharge signal FPCG changes from a logic low level to a logic high level, and then are all disabled to a logic low level.

Figure 4:
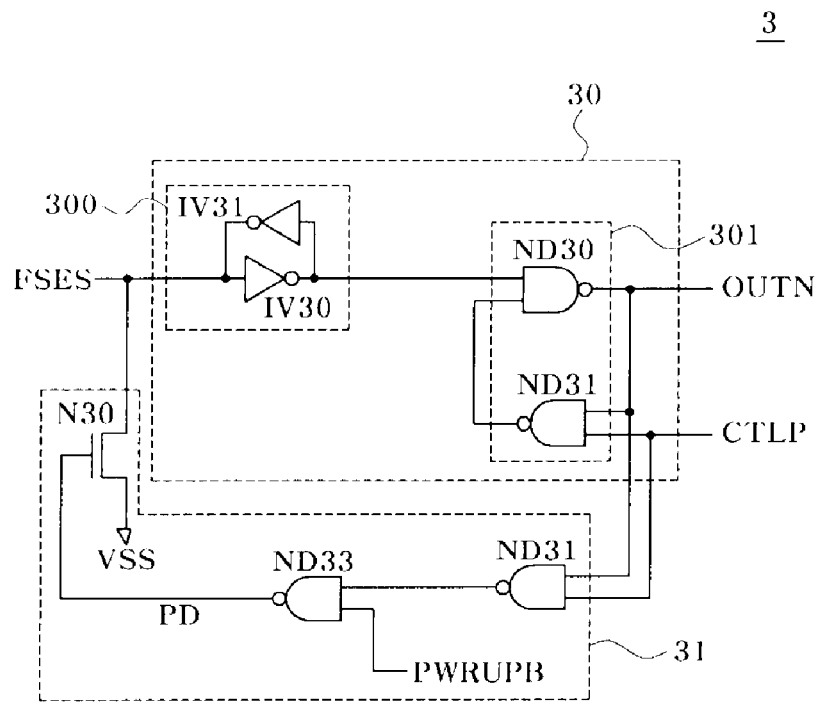
FIG. 4 is a circuit diagram of an output driving unit included in the fuse circuit of FIG. 2.

Referring to FIG. 4, the output driving unit 3 includes a buffer section 30 and a driving control section 31. The buffer section 30 is configured to buffer the fuse information signal FSES and generate a latch output signal OUTN. The driving control section 31 is configured to pull-down drive the fuse information signal FSES when the control signal CTLP is enabled to a logic high level.

The buffer section 30 includes a latch 300 and a selective latch 301. The latch 300 includes inverters IV30, IV31 and latches the fuse information signal FSES. The selective latch 301 buffers the output signal of the latch 300 and outputs the buffered signal as the latch output signal OUTN. The selective latch 301 latches the latch output signal OUTN when the control signal CTLP is enabled to a logic high level. The selective latch 301 includes NAND gates ND30, ND31. The NAND gate ND30 is configured to perform a NAND operation on the output signal of the latch 300 and an output signal of the NAND gate ND31 and to output the latch output signal OUTN. The NAND gate ND31 is configured to perform a NAND operation on the latch output signal OUTN and the control signal CTLP. The control signal CTLP is enabled to a logic high level in synchronization with the timing when the first to fourth selection signals SEL<1:4> are selectively applied at a logic high level, and the control signal CTLP is disabled to a logic low level in synchronization with the timing when the first to fourth selection signals SEL<1:4> are all applied at a logic low level.

The driving control section 31 includes NAND gates ND31, ND33 and an NMOS transistor N30. The NAND gate ND31 is configured to perform a NAND operation on the latch output signal OUTN and the control signal CTLP. The NAND gate ND33 is configured to perform a NAND operation on a power-up signal PWRUPB and the output signal of the NAND gate ND31 and generate a pull-down signal PD. The NMOS transistor N30 operates as a pull-down element which receives the pull-down signal PD and pull-down drives the fuse information signal FSES. The power-up signal PWRUPB is a signal which is at a logic low level during a power-up period and changes to a logic high level after the end of the power-up period.

The operations of the fuse circuit according to an embodiment of the present invention as described above will be described for a situation when the second selection signal SEL<2> among selection signals SEL<1:4> is applied at a logic high level.

When the precharge signal FPCG is applied at a logic low level in order for a precharge operation, the fuse information signal FSES outputted from the node nd20 is precharged to a logic high level. Therefore, the buffer section 30 latches and buffers the fuse information signal FSES and outputs the latch output signal OUT of a logic high level.

After the precharge signal FPCG changes to a logic high level, for example, in a preset timing, the second selection signal SEL<2> enabled to a logic high level is applied. The node nd22 is pull-down driven to the ground voltage VSS by the NMOS transistor N22, which is turned on in response to the second selection signal SEL<2> of a logic high level.

At this time, the latch output signal OUTN is latched by the control signal CTLP applied at a logic high level, and the pull-down signal PD of the driving control section 31 is generated at a logic high level. Thus, the NMOS transistor N30 is turned on, and the node nd20 through which the fuse information signal FSES is outputted is pull-down driven to the ground voltage VSS.

In this manner, when the node nd22 is pull-down driven to the ground voltage VSS by the second selection signal SEL<2> applied at a logic high level, the node nd20 through which the fuse information signal FSES is outputted is also pull-down driven. Therefore, the potential difference between both terminals of the cut second fuse F22, that is, the node nd20 and the node nd22, does not occur, thereby preventing the occurrence of error that the cut second fuse F22 is again coupled to output the latch output signal OUTN at a logic low level.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A fuse circuit comprising:
a fuse information signal generation unit configured to precharge a fuse information signal in response to a precharge signal, and drive the fuse information signal in response to a selection signal; and
an output driving unit configured to maintain the potentials at both terminals of the fuse equal or substantially equal in response to a control signal,
wherein the output driving unit comprises:
a latch configured to latch the fuse information signal;
a selective latch configured to buffer an output signal of the latch and generate the latch output signal and to latch the latch output signal when the control signal is enabled; and
a driving control section configured to pull-down drive the fuse information signal when the control signal is enabled.

2. The fuse circuit of claim 1, wherein the fuse information signal generation unit comprises:
a precharge element configured to pull-up drive the fuse information signal in response to a precharge signal; and
a pull-down section configured to pull-down drive the fuse information signal in response to the selection signal and the cutting of the fuse.

3. The fuse circuit of claim 2, wherein the precharge element comprises a MOS transistor coupled between a power supply voltage terminal and a first node through which the fuse information signal is outputted, and configured to pull-up drive the first node in response to the precharge signal.

4. The fuse circuit of claim 3, wherein the pull-down section comprises:
the fuse coupled between the first node and a second node; and a switch coupled between the second node and a ground voltage terminal and configured to be turned on in response to the selection signal.

5. The fuse circuit of claim 1, wherein the control signal is enabled in synchronization with an enable timing of the selection signal and disabled in synchronization with a disable timing of the selection signal.

6. The fuse circuit of claim 1, wherein the selective latch comprises:
   a first logic element configured to perform a logic operation on the latch output signal and the control signal; and
   a second logic element configured to perform a logic operation on an output signal of the first logic element and the fuse information signal.

7. The fuse circuit of claim 6, wherein the driving control section comprises:
   a first transfer element configured to buffer and transfer the latch output signal when the control signal is enabled;
   a second transfer element configured to transfer an output signal of the first transfer element as a pull-down signal in response to a power-up signal; and
   a pull-down element configured to pull-down drive the fuse information signal in response to the pull-down signal.

8. The fuse circuit of claim 7, wherein the first and second transfer elements are implemented with logic elements which perform a NAND operation, and the pull-down element is implemented with an NMOS transistor.

9. A fuse circuit comprising:
   a precharge unit configured to precharge a fuse information signal in response to a precharge signal;
   a fuse coupled between a first node and a second node;
   a switch element configured to be turned on in response to a selection signal to pull-down drive the second node; and
   an output driving unit configured to pull-down drive the first node in response to a control signal, wherein output driving unit comprises the a latch configured to latch the fuse information signal, a selective latch configured to buffer an output signal of the latch and generate the latch output signal, and to latch the latch output signal when the control signal is enabled, and a driving control section configured to pull-down drive the fuse information signal when the control signal is enabled.

10. The fuse circuit of claim 9, wherein the control signal is enabled in synchronization with an enable timing of the selection signal and disabled in synchronization with a disable timing of the selection signal.

11. The fuse circuit of claim 10, wherein the driving control section comprises:
    a first transfer element configured to buffer and transfer a latch output signal when the control signal is enabled;
    a second transfer element configured to transfer an output signal of the first transfer element as a pull-down signal in response to a power-up signal; and
    a pull-down element configured to pull-down drive the fuse information signal in response to the pull-down signal.

12. The fuse circuit of claim 11, wherein the first and second transfer elements are implemented with logic elements which perform a NAND operation, and the pull-down element is implemented with an NMOS transistor.

* * * * *